(12) United States Patent
Bamesberger et al.

(10) Patent No.: US 10,416,576 B2
(45) Date of Patent: Sep. 17, 2019

(54) OPTICAL SYSTEM FOR USE IN STAGE CONTROL

(71) Applicant: Canon Kabushiki Kaisha, Tokyo (JP)

(72) Inventors: Seth J. Bamesberger, Austin, TX (US); Yeshwanth Srinivasan, Austin, TX (US); Philip D. Schumaker, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 190 days.

(21) Appl. No.: 15/265,273

(22) Filed: Sep. 14, 2016

(65) Prior Publication Data
US 2018/0074418 A1 Mar. 15, 2018

(51) Int. Cl.
G03F 9/00 (2006.01)
G03F 7/00 (2006.01)

(52) U.S. Cl.
CPC .......... G03F 9/7042 (2013.01); G03F 7/0002 (2013.01)

(58) Field of Classification Search
None
See application file for complete search history.

(56) References Cited

U.S. PATENT DOCUMENTS

| | | | |
|---|---|---|---|
| 8,345,242 B2 | 1/2013 | Schumaker et al. | |
| 2006/0132629 A1* | 6/2006 | Tsuruoka | H04N 9/045 348/280 |
| 2007/0047004 A1* | 3/2007 | Sakurai | H04N 1/02409 358/302 |
| 2010/0102487 A1* | 4/2010 | Schumaker | B82Y 10/00 264/408 |

* cited by examiner

Primary Examiner — Matthew J Daniels
Assistant Examiner — Mohammad M Ameen
(74) Attorney, Agent, or Firm — Fish & Richardson P.C.

(57) ABSTRACT

Methods, systems, and apparatus, including computer programs encoded on a computer storage medium, for aligning a template and a substrate, the method including obtaining a moiré image based on an interaction of light between corresponding features of the template and the substrate, the moiré image including a plurality of moiré fringe strips; compressing each moiré fringe strip of the moiré image by an optical lens array based on a pixel height of an acquisition device, the acquisition device including one or more line scan cameras; processing the compressed moiré image by each of the line scan cameras of the acquisition device to determine a misalignment between the template and the substrate; and based on the determined misalignment, adjusting a relative positioning between the template and the substrate.

6 Claims, 6 Drawing Sheets

Trilinear Line Scan Camera

OPTICAL SYSTEM FOR USE IN STAGE CONTROL

BACKGROUND

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed.

During imprint lithography, precise alignment of the substrate relative to the template is desired to minimize production defects. Typically this alignment may involve complicated or expensive interferometric devices which are difficult to calibrate, expensive to maintain, and can be inaccurate depending on the location of these devices. Furthermore, it has proven difficult to obtain adequate imagery of substrates during imprint lithography.

SUMMARY

Innovative aspects of the subject matter described in this specification may be embodied in methods that include the actions of aligning a template and a substrate, the method including obtaining a moiré image based on an interaction of light between corresponding features of the template and the substrate, the moiré image including a plurality of moiré fringe strips; compressing each moiré fringe strip of the moiré image by an optical lens array based on a pixel height of an acquisition device, the acquisition device including one or more line scan cameras; processing the compressed moiré image by each of the line scan cameras of the acquisition device to determine a misalignment between the template and the substrate; and based on the determined misalignment, adjusting a relative positioning between the template and the substrate.

Other embodiments of these aspects include corresponding systems, apparatus, and computer programs, configured to perform the actions of the methods, encoded on computer storage devices.

These and other embodiments may each optionally include one or more of the following features. For instance, compressing the moiré image may include compressing a height of the moiré image based on the pixel height of the acquisition device. Compressing the moiré image may include compressing each of the moiré fringe strips individually. In some examples, each of the compressed moiré fringe strips are focused to separate lines of the acquisition device. Compressing the moiré image may include compressing each of the moiré fringe strips into a single compressed moiré fringe strip. In some examples, the single compressed moiré fringe strip is focused to a single line of the acquisition device. Adjusting the positioning between the template and the substrate may include moving the template, the substrate, or both in a plane having two orthogonal axes, rotating about an axis orthogonal to the plane, or both.

Innovative aspects of the subject matter described in this specification may be embodied in a system that includes a template configured to render an imprint and comprising alignment indicia; a substrate configurable to replicate the imprint and comprising alignment indicia; an illuminator configured to illuminate the template and the substrate; an optical lens array to optically compress each moiré fringe strip of a moiré image, the moiré image resulting from an interaction of light between the alignment indicia of the template and the alignment indicia of the substrate; and an acquisition device that includes one or more line scan cameras that are configured to process the compressed moiré image to determine a misalignment between the template and the substrate, wherein the compression of the moiré image is based on a pixel height of the acquisition device.

Other embodiments of these aspects include corresponding systems, apparatus, and computer programs, configured to perform the actions of the methods, encoded on computer storage devices.

These and other embodiments may each optionally include one or more of the following features. For instance, the optical lens array may compress a height of the moiré image based on the pixel height of the acquisition device. The optical lens array compresses each of the moiré fringe strips individually. In some cases, the acquisition device includes a trilinear line scan camera, and each line of the camera is associated with a particular moiré fringe strip of the moiré fringe strips. In certain cases, the optical lens array compresses each of the moiré fringe strips into a single compressed moiré fringe strip. The acquisition device may include a single line scan camera that processes the single compressed moiré fringe strip. A stage controller adjusts a relative positioning between the template and the substrate based on the determined misalignment.

Particular implementations of the subject matter described in this specification can be implemented so as to realize one or more of the following advantages. Implementations of the present disclosure may provide i) reduction of convergence times of X, Y, and θ alignment; ii) reduction of alignment steady-state values to sub-five nanometers; iii) X, Y, and θ movement of the stage may realize a more stable closed loop control; iv) relative alignment is sensed at a highly relevant location (improve feedback loop performance); and/or v) optical integration improves the signal intensity of each moiré strip at a given sensing rate and/or faster sensing rates for a given intensity.

The details of one or more embodiments of the subject matter described in this specification are set forth in the accompanying drawings and the description below. Other potential features, aspects, and advantages of the subject matter will become apparent from the description, the drawings, and the claims.

DETAILED DESCRIPTION

This document describes methods and systems that provide an alignment between a template and a substrate. Specifically, a moiré image is obtained based on the interaction of light between corresponding features of the template and the substrate. The moiré image is compressed based on a pixel height of an acquisition device. The compressed moiré image is processed by the acquisition device to determine a misalignment between the template and the substrate. A relative positioning is adjusted between the template and the substrate based on the determined misalignment.

Figure 1:
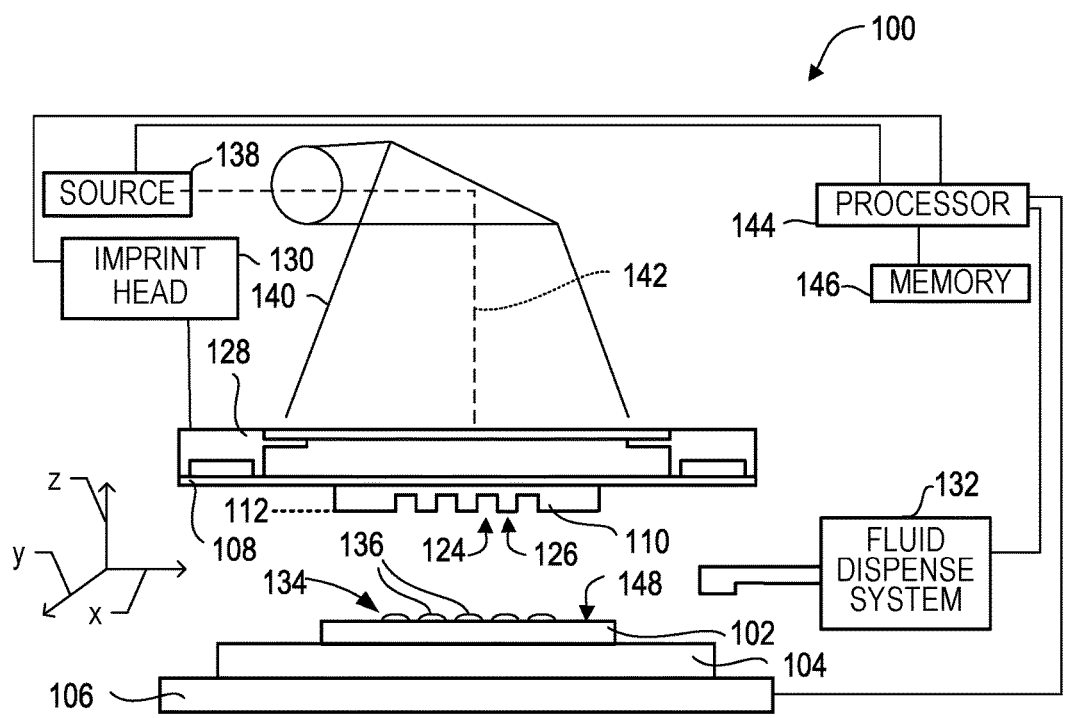
FIG. 1 illustrates a simplified side view of a lithographic system in accordance with embodiments of the present invention.

FIG. 1 illustrates an imprint lithography system 100 that forms a relief pattern on a substrate 102. The substrate 102 may be coupled to a substrate chuck 104. In some examples, the substrate chuck 104 can include a vacuum chuck, a pin-type chuck, a groove-type chuck, an electromagnetic chuck, and/or the like. Exemplary chucks are described in U.S. Pat. No. 6,873,087, which is hereby incorporated by reference herein. The substrate 102 and the substrate chuck 104 may be further supported by a stage 106. The stage 106 provides motion about the x-, y-, and z-axes. The stage 106, the substrate 102, and the substrate chuck 104 may also be positioned on a base (not shown).

The imprint lithography system 100 further includes an imprint lithography template 108 that is spaced-apart from the substrate 102. In some examples, the template 108 includes a mesa 110 (mold 110) that extends from the template 108 towards the substrate 102. In some examples, the mold 110 includes a patterning surface 112. The template 108 and/or the mold 110 may be formed from such materials including, but not limited to, fused-silica, quartz, silicon, organic polymers, siloxane polymers, borosilicate glass, fluorocarbon polymers, metal, hardened sapphire, and/or the like. In the illustrated example, the patterning surface 122 includes a plurality of features defined by spaced-apart recesses 124 and/or protrusions 126. However, in some examples, other configurations of features are possible. The patterning surface 112 may define any original pattern that forms the basis of a pattern to be formed on substrate 102.

The template 108 may be coupled to a template chuck 128. In some examples, the template chuck 128 can include a vacuum chuck, a pin-type chuck, a groove-type chuck, an electromagnetic chuck, and/or the like. Exemplary chucks are described in U.S. Pat. No. 6,873,087, which is hereby incorporated by reference herein. Further, the template chuck 128 may be coupled to an imprint head 130 such that the template chuck 128 and/or the imprint head 130 may be configured to facilitate movement of the template 118.

The imprint lithography system 100 may further include a fluid dispense system 132. The fluid dispense system 132 may be used to deposit a polymerizable material 134 on the substrate 102. The polymerizable material 134 may be positioned upon the substrate 102 using techniques such as drop dispense, spin-coating, dip coating, chemical vapor deposition (CVD), physical vapor deposition (PVD), thin film deposition, thick film deposition, and/or the like. In some examples, the polymerizable material 134 is positioned upon the substrate 102 before and/or after a desired volume is defined between the mold 110 and the substrate 102. The polymerizable material 134 may include a monomer as described in U.S. Pat. No. 7,157,036 and U.S. Patent Application Publication No. 2005/0187339, all of which are hereby incorporated by reference herein. In some examples, the polymerizable material 134 is positioned upon the substrate 102 as a plurality of droplets 136.

Figure 2:
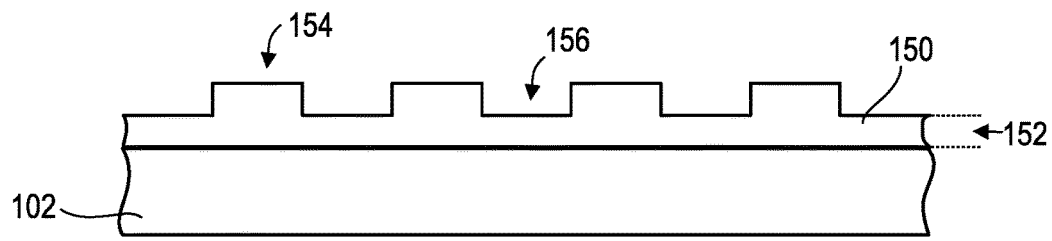
FIG. 2 illustrates a simplified side view of the substrate shown in FIG. 1 having a patterned layer positioned thereon.

Referring to FIGS. 1 and 2, the imprint lithography system 100 may further include an energy source 138 coupled to direct energy 140 along a path 142. In some examples, the imprint head 130 and the stage 106 is configured to position the template 108 and the substrate 102 in superimposition with the path 142. The imprint lithography system 110 may be regulated by a processor 144 in communication with the stage 106, the imprint head 130, the fluid dispense system 132, and/or the energy source 138, and may operate on a computer readable program stored in a memory 146.

In some examples, the imprint head 130, the stage 106, or both, vary a distance between the mold 110 and the substrate 102 to define a desired volume therebetween that is filled by the polymerizable material 134. For example, the imprint head 130 may apply a force to the template 108 such that the mold 110 contacts the polymerizable material 134. After the desired volume is filled by the polymerizable material 134, the energy source 138 produces energy 140, e.g., broadband ultraviolet radiation, causing the polymerizable material 134 to solidify and/or cross-link conforming to shape of a surface 148 of the substrate 102 and the patterning surface 122, defining a patterned layer 150 on the substrate 102. In some examples, the patterned layer 150 may include a residual layer 152 and a plurality of features shown as protrusions 154 and recessions 156, with the protrusions 154 having a thickness $t_1$ and the residual layer 152 having a thickness $t_2$.

The above-described system and process may be further implemented in imprint lithography processes and systems referred to in U.S. Pat. No. 6,932,934, U.S. Patent Application Publication No. 2004/0124566, U.S. Patent Application Publication No. 2004/0188381, and U.S. Patent Application Publication No. 2004/0211754, each of which is hereby incorporated by reference herein.

To that end, it is desired to have the substrate 102 and/or the template 108 in a desired alignment to minimize, if not prevent, production defects.

Figure 3:
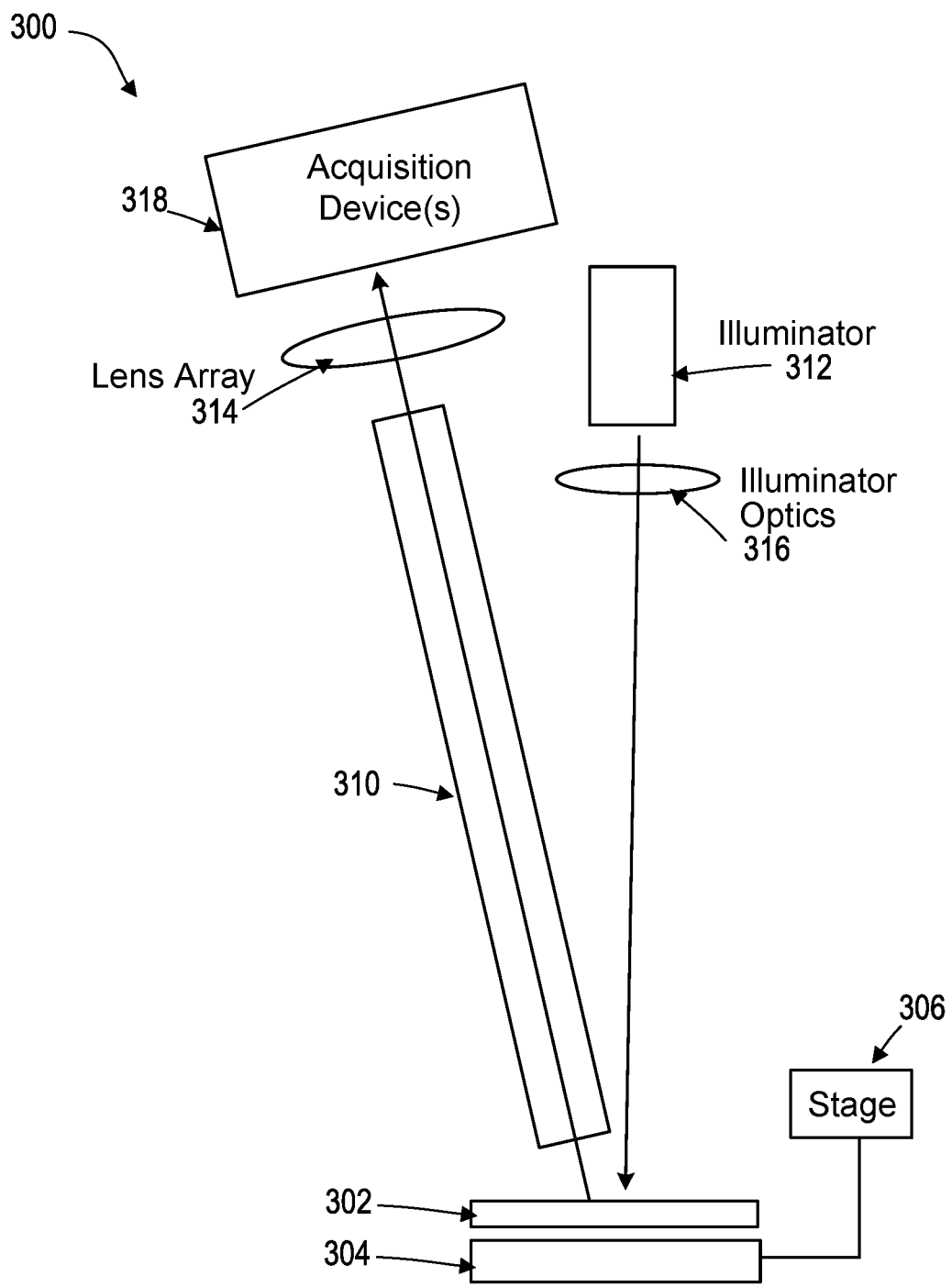
FIG. 3 illustrates an optical system for providing imaging of a template and a substrate.

FIG. 3 illustrates an optical system 300 for providing imaging of a template 302, similar to the template 108 of FIG. 1, and a substrate 304, similar to the substrate 102 of FIG. 1. In some examples, the optical system 300 provides real-time or near real-time imaging of the template 302, the substrate 304, or both, to facilitate a relative alignment between the template 302 and the substrate 304 through movement of a stage 306, similar to the stage 106 of FIG. 1. In some examples, a stage (not shown) is coupled to the template 302 to adjust a relative positioning thereof. The template 302 and the substrate 304 each include respective alignment indicia. In some examples, the respective alignment indicia include reference markings, surface features, or other indicia which may be used for alignment, described further below. The optical system 300 further includes a microscope 310, an illuminator 312, an optical lens array 314, illuminator optics 316, and an acquisition device 318.

In some examples, the acquisition device 318 is associated with a pixel height. That is, in some examples, the acquisition device 318 includes a trilinear line scan camera, with each line of the trilinear line scan camera being associated with the pixel height. In some examples, the acquisition device 318 includes a single line scan camera, with the line of the single line scan camera associated with the pixel height and spacing of pixel lines. For example, the pixel height of the acquisition device 318 is in the range of 5 to 14 microns. In some examples, the acquisition device 318 is a one dimensional sensor.

In some implementations, a moiré image is obtained that is based on an interaction of light between alignment indicia of the template 302 and alignment indicia of the substrate 304. Specifically, light from the illuminator 312 illuminates the template 302 and the substrate 304. In some examples, the illuminator optics 316 consists of an aperture and relay lens to transmit and focus the light to the alignment indicia. To that end, when the template alignment indicia and/or the substrate alignment indicia (collectively referred to as alignment indicia) are illuminated by light from the illuminator 312, the alignment indicia may produce one or more moiré images. In some examples, the moiré image includes a plurality of moiré fringe strips. Each moiré fringe strip of the moiré image is associated with a height and a width, and further, each moiré fringe strip is separated from one another by a spacing. For example, each moiré fringe strip is associated with a height of 12 microns and a width of 50 microns, and the spacing between each moiré fringe strip is two microns. The microscope 310 provides a magnification of the obtained moiré image. In some examples, the magnification of the moiré image is based on parameters of the acquisition device 318, and specifically, a pixel density of the acquisition device 318.

In some implementations, the optical lens array 314 compresses the magnified moiré image. That is, the optical lens array 314 compresses the magnified moiré image in one or more dimensions, e.g., along a height, of the moiré image. In some examples, the optical lens array 314 compresses the moiré image based on the acquisition device 318, and specifically, the pixel height of the acquisition device 318. That is, the optical lens array 314 compresses a height of the moiré image based on the pixel height and pixel line spacing of the acquisition device 318. For example, the optical lens array 314 compresses the height of the moiré image to a height of one pixel. That is, the optical lens array 314 compresses the moiré image in one dimension, and specifically, compresses the height dimension of the moiré image to one pixel, while maintaining a width of the moiré image. In other words, the optical lens array 314 converts the moiré image from a two-dimensional image to a one-dimensional image. In some examples, the optical lens array 314 compresses the magnified moiré image includes optically integrating the moiré image anisotropically.

In some examples, the optical lens array 314 includes a single or series of cylindrical plano-convex lenses. In some examples, the optical lens array 314 includes one or more relay lenses. Specifically, relay lenses provide increasing the distance between the moiré image and the acquisition device 318 while providing a desirable focus of the same.

Figure 4:
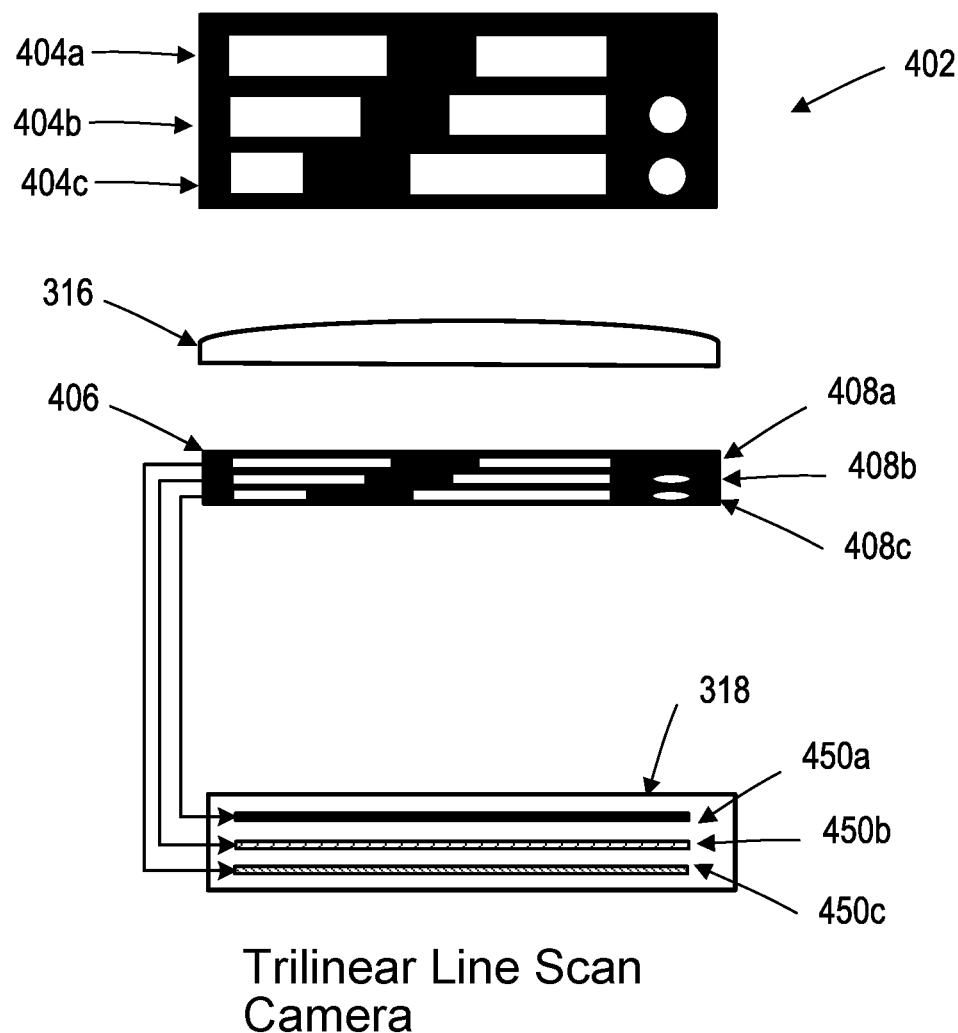
FIG. 4 illustrates a system for processing of moiré strips, including a trilinear line scan camera.

Referring to FIG. 4, a simplified view of the processing of the moiré strips is shown. Specifically, a moiré image 402 is shown including moiré fringe strips 404a, 404b, 404c (collectively referred to as moiré fringe strips 404). In some examples, the optical lens array 314 compresses each of the moiré fringe strips 404 individually. That is, each of the moiré fringe strips 404 is compressed by the optical lens array 314 into separate compressed moiré fringe strips, shown as a compressed moiré image 406 including compressed moiré fringe strips 408a, 408b, 408c (collectively referred to as compressed moiré fringe strips 408). Specifically, the moiré fringe strips 404a, 404b, 404c correspond to compressed moiré fringe strips 408a, 408b, 408c, respectively. For example, the optical lens array 314 compresses a height of each of the moiré fringe strips 404 to provide the compressed moiré fringe strips 408 each having a pixel height based on the acquisition device 318 (e.g., a pixel height of the acquisition device 318). For example, the compressed moiré fringe strips 408 are associated with a pixel height of 5 to 14 microns. In other words, the optical lens array 314 compresses the moiré fringe strips 404 to provide three one-dimensional compressed moiré fringe strips 408. In some examples, the optical lens array 314 compresses the moiré fringe strips 404 to provide (project) an optically averaged moiré fringe strip to the acquisition device 318. That is, when the acquisition device 318 includes a trilinear line scan camera, the optically averaged moiré fringe strip is provided (projected) to each line of the trilinear line scan camera.

In some examples, the optical lens array 314 focuses each of the compressed moiré fringe strips 408 to a separate line of the acquisition device 318. Specifically, as mentioned above, the acquisition device 318 can include a trilinear line scan camera. To that end, the optical lens array 314 focuses each of the compressed moiré fringe strips 408 to a respective line of the acquisition device 318. Each line of the trilinear line scan camera, shown as lines 450a, 450b, 450c (collectively referred to as lines 450) is associated with a respective image acquisition portion of the trilinear line scan camera. By utilizing the optical lens array 314, detection of the moiré fringe strips 408 by the acquisition device 318 is improved, e.g., as compared to using only the microscope 310. For example, for a given sensing rate of the acquisition device 318, a signal intensity of the detection of the moiré fringe strips 408 is improved. Also, for example, for a given intensity of the detection of the moiré fringe strips 408, the sensing rate of the moiré fringe strips 408 by the acquisition device 318 is improved.

In some examples, the spacing between each of the compressed moiré fringe strips 408 is adjusted based on a spacing of the respective lines 450 of the acquisition device 318. That is, the optical lens array 314 adjusts the spacing between each of the compressed moiré fringe strips 408 such that each of the compressed moiré fringe strips 408 is associated with a respective line 450 of the acquisition device 318. In some examples, the optical lens array 314 adjusts the spacing between each of the compressed moiré fringe strips 408 such that the each of the lines 450 of the acquisition device 318 (e.g., a trilinear line scan camera) is able to optically detect the respective compressed moiré fringe strip 408. In some examples, the optical lens array 314 adjusts the spacing between each of the compressed moiré fringe strips 408 to match a spacing of the lines 450 of the acquisition device 318 (e.g., a trilinear line scan camera).

Figure 5:
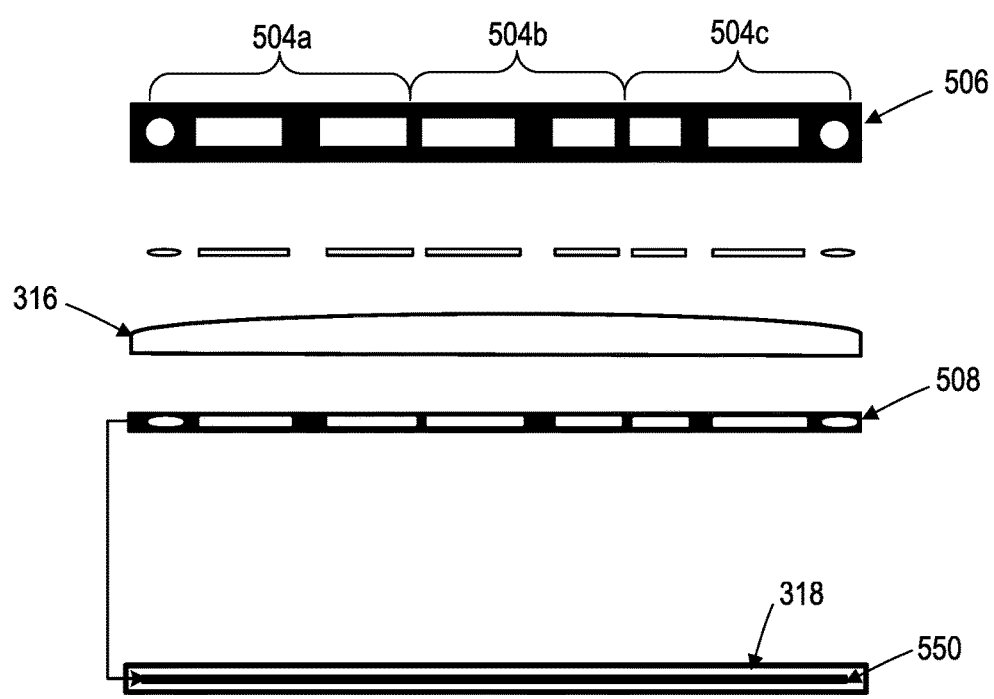
FIG. 5 illustrates a system for processing of moiré strips, including a line scan camera.

Referring to FIG. 5, a simplified view of the processing of the moiré strips is shown. Specifically, a moiré image is shown including moiré fringe strips 504a, 504b, 504c (collectively referred to as moiré fringe strips 504). In some examples, each of the moiré fringe strips 504 is included on a continuous moiré fringe strip 506. In some examples, the optical lens array 314 compresses each of the moiré fringe strips 504 into a single compressed moiré fringe strip 508. That is, each of the moiré fringe strips 504 are compressed by the optical lens array 314 into a single compressed moiré fringe strip 508. In some examples, the optical lens array 314 compresses a height of the continuous moiré fringe strip 506 to provide the compressed moiré fringe strip 508 that has a pixel height based on the acquisition device 318 (e.g., a pixel height of the acquisition device 318). For example, the compressed moiré fringe strip 508 is associated with a pixel height of 5 to 14 microns. In other words, the optical lens array 314 compresses the continuous moiré fringe strip 506 to provide the single one-dimensional compressed moiré fringe strip 508.

In some examples, the optical lens array 314 focuses the compressed moiré fringe strip 508 to a single line of the acquisition device 318. Specifically, as mentioned above, the acquisition device 318 can include a line scan camera. To that end, the optical lens array 314 focuses the compressed moiré fringe strip 508 to a line 550 of the acquisition device 318. That is, the line 550 is associated with an image acquisition portion of the line scan camera.

In some implementations, the acquisition device 318 processes the compressed moiré image to determine a misalignment between the template 302 and the substrate 304. Specifically, the acquisition device 318 processes the compressed moiré image (e.g., the compressed moiré fringe strip 408, or the compressed moiré fringe strip 508). In some examples, the acquisition device 318 processes the compressed moiré image by optically detecting a misalignment based on the compressed moiré image.

Figure 6:
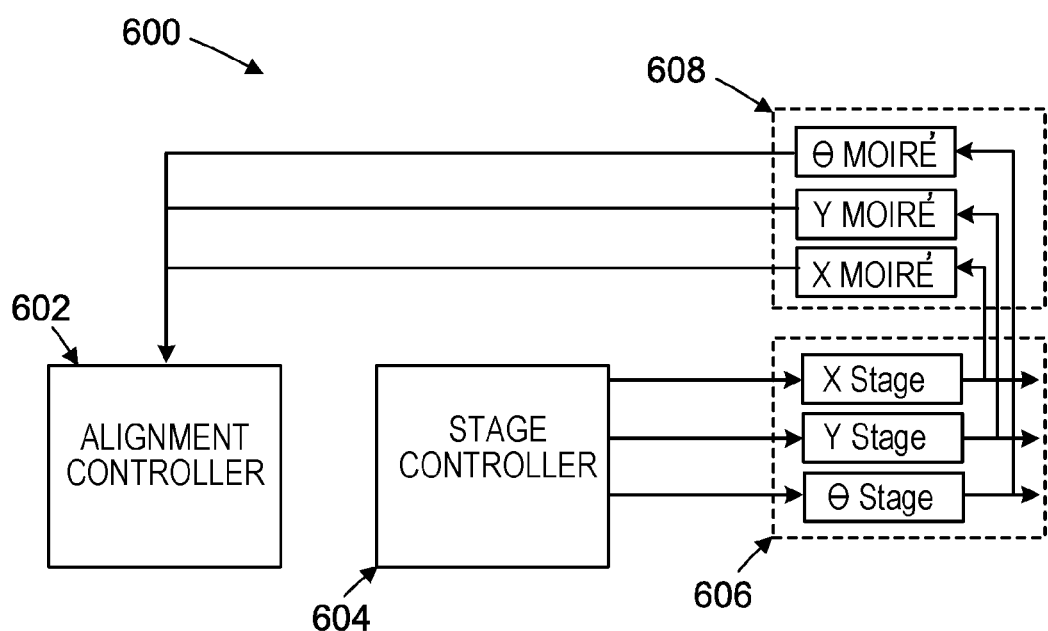
FIG. 6 illustrates an alignment system that adjusts relative positioning of the template and/or the substrate.

FIG. 6 illustrates an alignment system 600 that adjusts a relative positioning of the template 302 and/or the substrate 304 based on the determined misalignment. Specifically, the alignment system 600 includes an alignment controller 602, a stage controller 604, a stage 606, similar to the stage 106 of FIG. 1, and an optical system 608, similar to the optical system 300 of FIG. 3. To that end, as the compressed moiré image (e.g., the compressed moiré fringe strip 408, the compressed moiré fringe strip 508) varies with the extent of the misalignment between the template 302 and the substrate 304. Thus, based on the determined misalignment, stage controller 604 provides movement to the stage 606 to adjust the relative positioning of the template 302 and/or the substrate 304. Movement may include translation in plane comprising two orthogonal axes (X, Y), rotation (Θ) about an axis orthogonal to the plane, or both.

In some examples, the acquisition device 318 determines the misalignment between the template 302 and the substrate 304 at a rate greater than a bandwidth at which the stage controller 604 provides movement to the stage 606 to adjust the relative positioning of the template 302 and/or the substrate 304. As a result, encoders (not shown) for detecting the position of the stage 606 are abrogated and an improved stabled closed loop control of the alignment system 600 is provided. Moreover, errors associated with inclusion of the encoders within the alignment system 600 are eliminated to improve a feedback performance loop of the alignment system 600.

Additionally, in some examples, by determining the misalignment between the template 302 and the substrate 304 utilizing the acquisition device 318 and the optical lens array 314, the alignment system 600 is not limited by the bandwidth of the acquisition device 318, and further, use of high intensity illumination source is abrogated. Furthermore, by determining the misalignment between the template 302 and the substrate 304 utilizing the acquisition device 318 and the optical lens array 314, use of a digital micromirror device (DMD) to direct light from the moiré image to the acquisition device 318 is abrogated, and further, the alignment system 600 is not limited by the bandwidth of the DMD, which can be less than a bandwidth of the acquisition device 318 (and specifically, a trilinear line scan camera)

For example, as the optical system 608 provides images of the template 302 and the substrate 304 in real-time (or near real-time), the alignment controller 602 processes X-moiré, Y-moiré, and Θ-moiré patterns (e.g., based on the compressed moiré fringe strip 408, the compressed moiré fringe strip 508) to provide positioning information to the stage controller 604. Based on such information (and the current positioning of the template 302 and/or the substrate 304), the stage controller adjusts the relative positioning of the template 302 and/or the substrate 304, e.g., to bring the template 302 and the substrate 304 into a desired alignment, for example, by adjusting the positioning of the stage 606. In some examples, the optical lens array 314 optically averages the moiré image and converts the moiré image from a two-dimensional image to a one-dimensional image, with the acquisition device 318 providing imaging of the same. As a result, the alignment system 600 provides direct sensing of the misalignment between the template 302 and the substrate 304 to the stage controller 604.

In some examples, by utilizing the acquisition device 318, and specifically, a line scan camera, timeliness of the detection and correction of the misalignment between the template 302 and the substrate 304 is improved, thereby reducing convergence times for X, Y, and Θ alignment. Furthermore, reduction in the convergence times for X, Y, and Θ alignment can result in decreased steady state alignment errors, e.g., less than 5 nanometers, and increased throughput of an imprint lithography process, as described above in FIGS. 1 and 2, e.g., greater than 10 wafers per hour.

Figure 7:
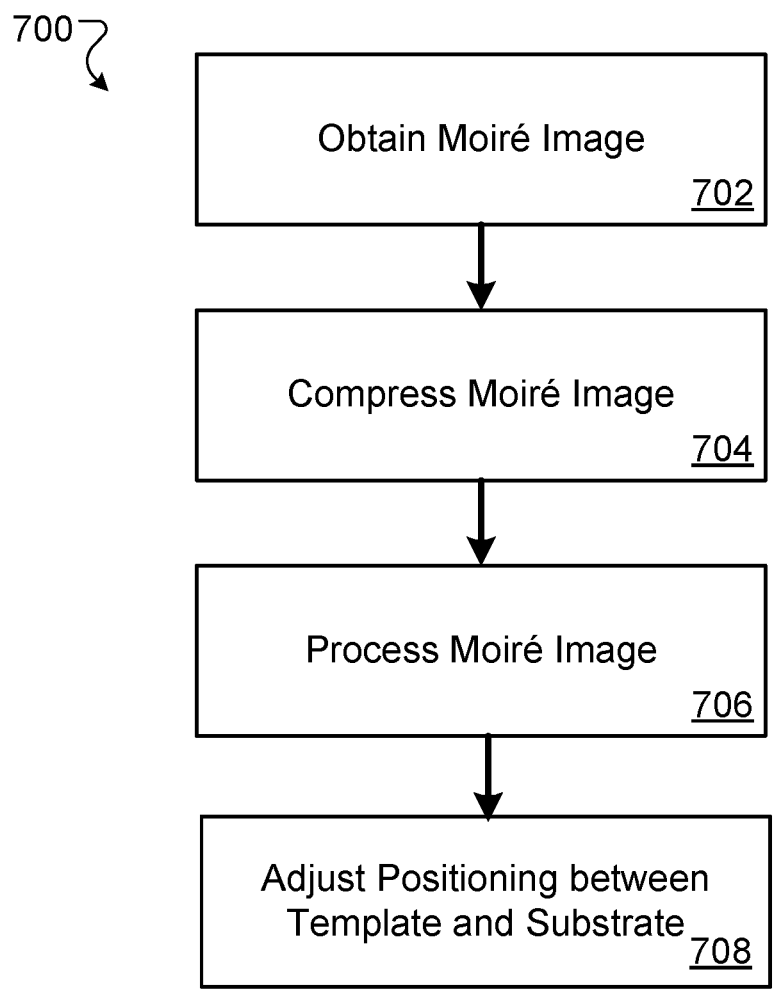
FIG. 7 is an example process for aligning the template and the substrate.

FIG. 7 illustrates an example method for aligning a template and a substrate. The process 700 is illustrated as a collection of referenced acts arranged in a logical flow graph. The order in which the acts are described is not intended to be construed as a limitation, and any number of the described acts can be combined in another order and/or in parallel to implement the process. A moiré image is obtained based on the interaction of light between corresponding features of the template and the substrate (702). For example, the moiré image 402 is obtained based on the interaction of light between alignment indicia of the template 302 and the substrate 304. In some examples, the moiré image includes a plurality of moiré fringe strips. Each of the moiré fringe strips of the moiré image is compressed by an optical lens array based on a pixel height of an acquisition device (704). For example, the moiré image 402 is compressed based on the pixel height of the acquisition device 318. In some examples, the acquisition device includes one or more line scan cameras. The compressed moiré image is processed by each of the line scan cameras of the acquisition device to assess a misalignment between the template end the substrate (706). For example, the compressed moiré image 408 is processed by the acquisition device 318 to determine a misalignment between the template 302 and the substrate 304. A relative positioning is adjusted between the template and the substrate based on the determined misalignment (708). For example, the relative positioning between the substrate 304 and the template 302 is adjusted by the stage controller 604 based on the determined misalignment.

What is claimed is:

1. An imprint lithography system comprising:
    a template chuck or holder configured to hold a template comprising alignment indicia;
    a substrate chuck or holder configured to hold a substrate comprising alignment indicia;
    an illuminator configured to illuminate the template and the substrate;
    an optical lens array to optically compress each moiré fringe strip of a moiré image comprising moiré fringe strips, the moiré image resulting from an interaction of light between the alignment indicia of the template and the alignment indicia of the substrate; and an acquisition device that includes one or more line scan cameras that are configured to process the compressed moiré image to determine a misalignment between the template and the substrate, wherein the one or more line scan cameras include a trilinear line scan camera, each line of the trilinear line scan camera is associated with a particular moiré fringe strip of the moiréfringe strips, and the compression of the moiré image is based on a pixel height of the acquisition device.

2. The imprint lithography system of claim 1, wherein the optical lens array compresses a height of the moiré image based on the pixel height of the acquisition device.

3. The imprint lithography system of claim 1, wherein the optical lens array compresses each of the moiré fringe strips individually.

4. The imprint lithography system of claim 1, wherein the optical lens array compresses each of the moiré fringe strips into a single compressed moiré fringe strip.

5. The imprint lithography system of claim 4, wherein the acquisition device includes a single line scan camera that processes the single compressed moiré fringe strip.

6. The imprint lithography system of claim 1, further comprising a stage controller to adjust a relative positioning between the template and the substrate based on the determined misalignment.

\* \* \* \* \*